(12) United States Patent
Moriya et al.

(10) Patent No.: US 6,927,439 B2
(45) Date of Patent: Aug. 9, 2005

(54) SEMICONDUCTOR MEMORY WITH STRONGLY ADHESIVE ELECTRODE

(75) Inventors: Hiroshi Moriya, Chiyoda (JP); Tomio Iwasaki, Tsukuba (JP); Hiroyuki Ohta, Tsuchiura (JP); Shinpei Iijima, Akishima (JP); Isamu Asano, Iruma (JP); Yuzuru Ohji, Hinode (JP); Yoshitaka Nakamura, Oume (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/923,002

(22) Filed: Aug. 23, 2004

(65) Prior Publication Data

US 2005/0024811 A1 Feb. 3, 2005

Related U.S. Application Data

(62) Division of application No. 09/800,493, filed on Mar. 8, 2001, now Pat. No. 6,781,172.

(30) Foreign Application Priority Data

Mar. 8, 2000 (JP) .......................................... 2000-63735

(51) Int. Cl.[7] .............................................. H01L 29/76
(52) U.S. Cl. ...................................... 257/295; 257/310
(58) Field of Search ............................... 257/208, 295, 257/296, 300, 301, 302, 303, 304, 305, 306, 307, 308, 309, 310, 311

(56) References Cited

U.S. PATENT DOCUMENTS

| | | | |
|---|---|---|---|
| 5,142,437 A | 8/1992 | Kammerdiner et al. | |
| 5,555,486 A | 9/1996 | Kingon et al. | |
| 5,760,474 A | 6/1998 | Schuele | |
| 5,789,268 A | * | 8/1998 | Chivukula et al. |
| 6,015,989 A | 1/2000 | Horikawa et al. | |
| 6,228,699 B1 | * | 5/2001 | Huang |
| 6,235,557 B1 | * | 5/2001 | Manley |
| 6,323,511 B1 | 11/2001 | Marsh | |
| 6,521,932 B1 | 2/2003 | Kumagai et al. | |

FOREIGN PATENT DOCUMENTS

JP 9186299 of 1997
JP 10189881 of 1998

OTHER PUBLICATIONS

Wolf, "Silicon Processing for the VLSI Era, vol. 2—Process Integration," 1990, Lattice Press, vol. 2, pp. 194–196.

* cited by examiner

Primary Examiner—Nathan J. Flynn
Assistant Examiner—Kevin Quinto
(74) Attorney, Agent, or Firm—Antonelli, Terry, Stout & Kraus, LLP

(57) ABSTRACT

A semiconductor device equipped with information storage capacitor comprising a first capacitor electrode, an oxide film, a second capacitor electrode and insulating films containing silicon as a main constituting element, wherein at least one of first and second capacitor electrodes contains as a main constituting element at least one element selected from rhodium, ruthenium, iridium, osmium and platinum, and as an adding element at least one element selected from palladium, nickel, cobalt and titanium, is excellent in adhesiveness between the capacitor electrodes and the insulating films.

6 Claims, 12 Drawing Sheets

BLACK SPHERE IS Ti ATOM

IRREGULAR CONFIGURATION

Ti 26at.% ADDED Ru FILM (FILM THICKNESS : 3nm)

$SiO_2$ FILM

SEMICONDUCTOR MEMORY WITH STRONGLY ADHESIVE ELECTRODE

CROSS-REFERENCE TO RELATED APPLICATIONS

This is a Divisional application of application Ser. No. 09/800,493, filed Mar. 8, 2001 (now U.S. Pat. No. 6,781, 172), the entire disclosure of which is hereby incorporated by reference.

BACKGROUND OF THE INVENTION

This invention relates to a semiconductor device, particularly to a semiconductor device equipped with a capacitor for storing information excellent in adhesiveness between a capacitor electrode film and an insulating film.

With recent miniaturization of semiconductor devices, there is a tendency to reduce the area of a capacitor for storing information. And it is likely for the value of capacity to decrease. The capacity C in the case of, e.g. a parallel plate electrode structure is determined by the formula: $C = \in \cdot S/d$, wherein $\in$ is a dielectric constant, S is an area of electrode, and d is a thickness of dielectric (a distance between electrodes). In order to secure the capacity without increasing the area of electrode S used in the capacitor for storing information, it is necessary to reduce the film thickness d of dielectric. At present, the film thickness of capacitor dielectric films (insulating films) is reduced to about 10 nm. In the case of integrated memories of 64 M bit or more, thinness of the capacitor dielectric films is becoming to a limit. For this reason, materials for capacitor dielectric films having higher dielectric constant $\in$ are being developed now. For example, in the case of 64 to 256 M bit, the use of tantalum oxide ($Ta_2O_5$) is studied, and JP-A 9-186299 discloses the use of barium strontium titanate ($Ba_xSrTi_sO_t$: BST), etc. for 1 G bid DRAM. Further, as non-volatile memories, JP-A 10-189881 discloses the use of lead zirconate titanate ($Pb_xZr_yTi_sO_t$: PZT), etc.

It is known that these oxide films such as BST and PZT do not exhibit good properties unless subjected to high temperature treatment, such as as high as about 600° C. or higher. Thus, as the capacitor electrode materials contacting with the oxide film such as BST, PZT, etc., it is necessary to use a material which is hardly oxidized at high temperatures. This is because when the capacitor electrode is made of a material easily oxidized, oxidation reaction takes place at a contact interface between the electrode and the oxide film at high temperatures to deteriorate properties of the oxide film. From the above-mentioned background, there have been studied as hardly oxidized capacitor electrode materials noble metals such as rhodium (Rh), ruthenium (Ru), iridium (Ir), osmium (Os), platinum (Pt), etc., and electroconductive oxides such as ruthenium oxide ($Ru_xO_y$) and iridium oxide ($Ir_xO_y$), etc.

It is known that oxide films such as BST and PZT do not exhibit good properties unless subjected to high temperature treatment as mentioned above. And in order to use for DRAM having 1 G bit or more, it becomes to know that sufficient properties are not exhibited unless subjected to high temperature treatment in an oxygen atmosphere. Thus, in the production of DRAM having 1 G bit or more, it is necessary to conduct a high temperature treatment at about 600° C. or higher in an oxygen atmosphere. But, noble metals such as ruthenium which is studied as the electrode material have poor adhesion to silicon oxide ($SiO_2$) used as an insulating film, and show a problem of adhesive fracture when subjected to high temperature treatment particularly in oxygen atmosphere.

SUMMARY OF THE INVENTION

It is an object of the present invention to provide a semiconductor device improved in adhesiveness between capacitor electrodes formed by using as a principal material a noble metal such as ruthenium, platinum, or the like, or an electroconductive oxide such as ruthenium oxide, iridium oxide, or the like and an insulating film containing silicon. Another object of the present invention is to provide a semiconductor device having higher reliability. A further object of the present invention is to provide a semiconductor device having enhanced yield in the production thereof. The present invention still further provides a process for producing these semiconductor devices.

DETAILED DESCRIPTION OF THE INVENTION

Figure 1:
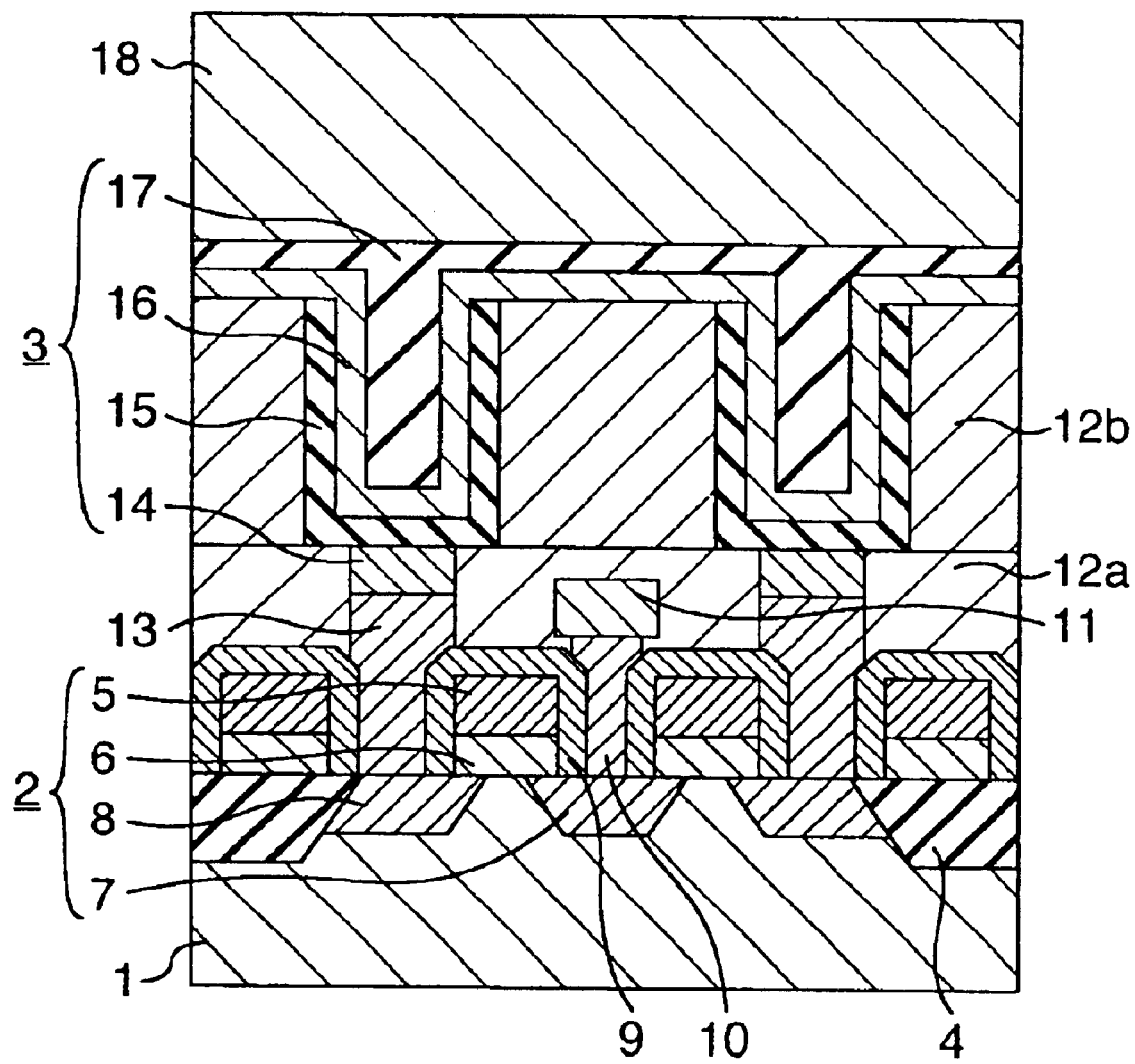
FIG. 1 is a cross-sectional view of the main part of the semiconductor device of Example 1.

The present inventors have earnestly studied improvement in adhesiveness between the capacitor electrode and the insulating film, and as a result, we have found the following things. First, as a cause of low adhesiveness between a capacitor electrode formed by a noble metal such as ruthenium, or an electroconductive oxide such as ruthenium oxide (hereinafter referred to as "capacitor electrode material") and silicon oxide film (insulating film), it was found that bond between the capacitor electrode material and the silicon, that is, bond energy between the capacitor electrode material and the silicon is too small. It was also found that in order to improve the adhesiveness, it is effective to add an element having a larger bond energy with silicon than the bond energy between the capacitor electrode material and the capacitor electrode material.

It was also found that it is important for the adding element to have the following factors. One of the factors is that when the bond energy between the adding element and the silicon is about 2 times or more as large as the bond energy between the capacitor electrode material and the silicon, it is possible to obtain necessary adhesiveness. That is, the adding element should have the bond energy with silicon which is 2 times as large as the bond energy between the capacitor electrode material and silicon.

Other factors relate to the following facts found by the present inventors mentioned below. According to the study of the present inventors, it is important not to cause disturbance undesirable for atomic configuration of the capacitor electrode material due to the adding element in the capacitor electrode film formed by the capacitor electrode material containing the adding element. For such a purpose, it is desirable that the atomic radius of the adding element is more close to that of the capacitor electrode material. In practice, the atomic radius of the adding element is required to have the value of 10% or less of that of the capacitor electrode material.

As the adding element satisfying the above-mentioned factors, there can be used palladium(Pd), nickel (Ni), cobalt (Co), titanium (Ti), etc. When ruthenium is used as the main constituting element of the capacitor electrode, the most preferable adding element is titanium and nickel.

The adding amount of the adding element to the capacitor electrode is, according to the present inventors' study, as follows. When the adding amount is over about 10 atom % (atomic percent), the adhesive fracture energy between the capacitor electrode and the silicon oxide film suddenly increases. When the adding amount is about 15 atom %, the adhesive fracture energy becomes almost constant. A critical amount of the adding amount of adding element is about 25 atom %. When the adding amount is over the critical value, the atomic configuration of the capacitor electrode material disturbs undesirably. Thus, the adding amount of the adding element is preferably about 10 atom % to about 25 atom %.

Embodiments of the present invention are as follows.

(1) A semiconductor device equipped with a capacitor for storing information comprising a substrate, a first capacitor electrode formed on the substrate, an oxide film formed in contact with the first capacitor electrode, a second capacitor electrode formed in contact with the oxide film, and an insulating film containing silicon as a main constituting element and formed in contact with the first capacitor electrode and second capacitor electrode, said first capacitor electrode or said second capacitor electrode containing as a main constituting element at least one element selected from the group consisting of rhodium, ruthenium, iridium, osmium, and platinum, and as an adding element at least one element selected from the group consisting of palladium, nickel, cobalt, and titanium.

(2) A semiconductor device equipped with a capacitor for storing information comprising a substrate, a first capacitor electrode formed on the substrate, an oxide film formed in contact with the first capacitor electrode, a second capacitor electrode formed in contact with the oxide film, and an insulating film containing silicon as a main constituting element and formed in contact with the first capacitor electrode and second capacitor electrode, said first capacitor electrode or said second capacitor electrode containing as a main constituting element ruthenium, and as an adding element at least one element selected from the group consisting of palladium, nickel, cobalt, and titanium.

(3) A semiconductor device equipped with a capacitor for storing information comprising a substrate, a first capacitor electrode formed on the substrate, an oxide film formed in contact with the first capacitor electrode, a second capacitor electrode formed in contact with the oxide film, and an insulating film containing silicon as a main constituting element and formed in contact with the first capacitor electrode and second capacitor electrode, said first capacitor electrode or said second capacitor electrode containing as a main constituting element ruthenium, and as an adding element titanium.

(4) A semiconductor device equipped with a capacitor for storing information comprising a substrate, a first capacitor electrode formed on the substrate, an oxide film formed in contact with the first capacitor electrode, a second capacitor electrode formed in contact with the oxide film, and an insulating film containing silicon as a main constituting element and formed in contact with the first capacitor electrode and second capacitor electrode, said first capacitor electrode or said second capacitor electrode containing as a main constituting element ruthenium, and as an adding element nickel.

(5) A semiconductor device equipped with a capacitor for storing information comprising a substrate, a first capacitor electrode formed on the substrate, an oxide film formed in contact with the first capacitor electrode, a second capacitor electrode formed in contact with the oxide film, and an insulating film containing silicon as a main constituting element and formed in contact with the first capacitor electrode and second capacitor electrode, said first capacitor electrode or said second capacitor electrode containing as a main constituting material at least one material selected from ruthenium oxide and iridium oxide, and as an adding element at least one element selected from the group consisting of palladium, nickel, cobalt, and titanium.

(6) A semiconductor device described in above (1) to (5), wherein the adding element is contained in a concentration of 10 to 25 atom %.

(7) A semiconductor device equipped with a capacitor for storing information comprising an oxide film for a dielectric formed between a first capacitor electrode and a second capacitor electrode, and an insulating film containing silicon as a main constituting element being formed for insulating the first capacitor electrode and the second capacitor electrode, wherein an electroconductive film containing as a main constituting element at least one element selected from the group consisting of palladium, nickel, cobalt and titanium is formed between the first capacitor electrode or the second capacitor electrode and the insulating film, and the first capacitor electrode or the second capacitor electrode is formed from at least one element selected from the group consisting of rhodium, ruthenium, iridium, osmium and platinum as a main constituting element.

(8) A semiconductor device equipped with a capacitor for storing information comprising an oxide film for a dielectric formed between a first capacitor electrode and a second capacitor electrode, and an insulating film containing silicon as a main constituting element being formed for insulating the first capacitor electrode and the second capacitor electrode, wherein an electroconductive film containing as a main constituting element at least one element selected from the group consisting of palladium, nickel, cobalt and titanium is formed between the first capacitor electrode or the second capacitor electrode and the insulating film, and the first capacitor electrode or the second capacitor electrode is formed from ruthenium as a main constituting element.

(9) A semiconductor device equipped with a capacitor for storing information comprising an oxide film for a dielectric formed between a first capacitor electrode and a second capacitor electrode, and an insulating film containing silicon as a main constituting element being formed for insulating the first capacitor electrode and the second capacitor electrode, wherein an electroconductive film containing as a main constituting element titanium is formed between the first capacitor electrode or the second capacitor electrode and the insulating film, and the first capacitor electrode or the second capacitor electrode is formed from ruthenium as a main constituting element.

(10) A semiconductor device equipped with a capacitor for storing information comprising an oxide film for a dielectric formed between a first capacitor electrode and a second capacitor electrode, and an insulating film containing silicon as a main constituting element being formed for insulating the first capacitor electrode and the second capacitor electrode, wherein an electroconductive film containing as a main constituting element at least one element selected from the group consisting of palladium, nickel, cobalt and titanium is formed between the first capacitor electrode or the second capacitor electrode and the insulating film, and the first capacitor electrode or the second capacitor electrode is formed from at least one material selected from the group consisting of ruthenium oxide and iridium oxide as a main constituting material.

(11) A semiconductor device equipped with a capacitor for storing information comprising a substrate, a first capacitor electrode formed on the substrate, an oxide film formed in contact with the first capacitor electrode, a second capacitor electrode formed in contact with the oxide film, and an insulating film containing silicon as a main constituting element and formed in contact with the first capacitor electrode and second capacitor electrode, wherein said first capacitor electrode or said second capacitor electrode is formed from a plurality of electrode films, and an electrode film among the plurality of electrode films contacting with the insulating film contains as a main constituting element at least one element selected from the group consisting of rhodium, ruthenium, iridium, osmium, and platinum, and as an adding element at least one element selected from the group consisting of palladium, nickel, cobalt, and titanium.

(12) A semiconductor device equipped with a capacitor for storing information comprising a substrate, a first capacitor electrode formed on the substrate, an oxide film formed in contact with the first capacitor electrode, a second capacitor electrode formed in contact with the oxide film, and an insulating film containing silicon as a main constituting element and formed in contact with the first capacitor electrode and second capacitor electrode, wherein said first capacitor electrode or said second capacitor electrode is formed from a plurality of electrode films, and an electrode film among the plurality of electrode films contacting with the insulating film contains as a main constituting material at least one material selected from the group consisting of ruthenium oxide and iridium oxide, and as an adding element at least one element selected from the group consisting of palladium, nickel, cobalt, and titanium.

(13) A semiconductor device described in above (11) or (12), wherein the adding element is contained in a concentration of 10 to 25 atom %.

(14) A process for producing a semiconductor device equipped with a capacitor for storing information comprising a substrate, a first capacitor electrode formed on the substrate, an oxide film formed in contact with the first capacitor electrode, a second capacitor electrode formed in contact with the oxide film, and an insulating film containing silicon as a main constituting element and formed in contact with the first capacitor electrode and second capacitor electrode, which comprises forming at least one of the first capacitor electrode and the second capacitor electrode by using (a) at least one element selected from the group consisting of rhodium, ruthenium, iridium, osmium and platinum as a main constituting element, or (b) at least one material selected from the group consisting of ruthenium oxide and iridium oxide as a main constituting material, and at least one element selected from the group consisting of palladium, nickel, cobalt, and titanium as an adding element.

(15) A process for producing a semiconductor device equipped with a capacitor for storing information comprising an oxide film formed between a first capacitor electrode and a second capacitor electrode, and an insulating film containing silicon as a main constituting element being formed for insulating the first capacitor electrode and the second capacitor electrode, which comprises forming an electroconductive film containing as a main constituting element at least one element selected from the group consisting of palladium; nickel, cobalt and titanium between the first capacitor electrode or the second capacitor electrode and the insulating film.

The present invention is illustrated by way of the following Examples, but needless to say, it is not limited thereto.

EXAMPLE 1

Figure 2:
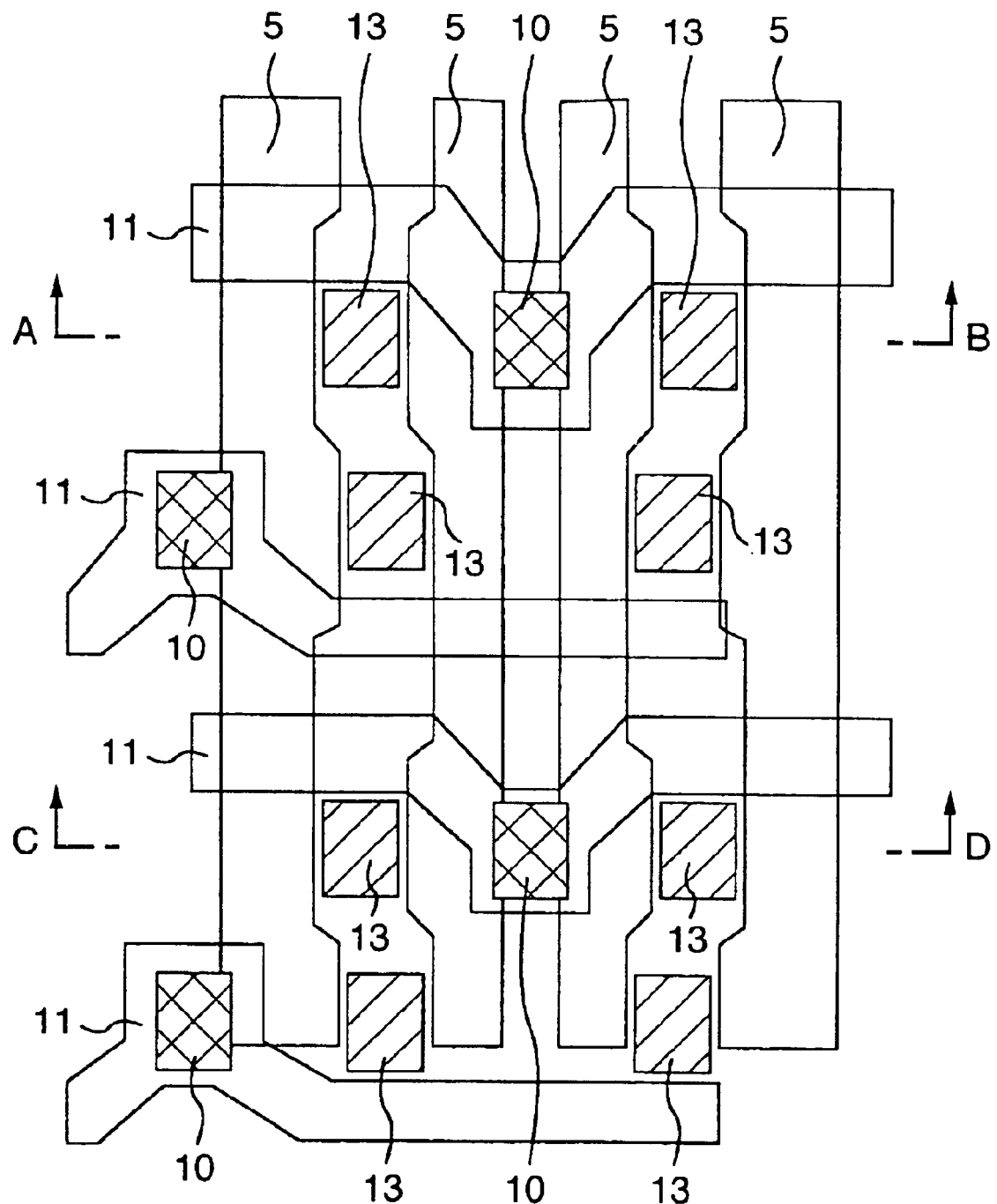
FIG. 2 is a plan view showing plane layout of the semiconductor device of Example 1.

The semiconductor device of this example takes a form of DRAM (dynamic random access memory). FIG. 1 is a cross-sectional view of the memory cell of DRAM and FIG. 2 is a part of plane layout of DRAM. Fig. is a cross-sectional view on line A–B or C–D of FIG. 2. As shown in FIG. 1, the semiconductor device (DRAM) equips a MOS (metal oxide semiconductor) transistors 2 formed on active regions of a main surface of a silicon substrate 1, and capacitor 3 for storing information positioned at upper portion of the transistors 2. These elements are arranged in parallel in the plane direction and separated by each insulating film 4.

The MOS transistors 2 for memory cell selection comprises a gate electrode 5, a gate insulating film 6, and diffusion layers 7 and 8. The gate insulating film 6 is made from, for example, a silicon oxide film, silicon nitride film or a ferroelectric substance film or a laminate thereof. The gate electrode 5 is made from, for example, a polycrystalline silicon film, a metal thin film or a metal silicide film or a laminate thereof. On upper portion and side walls of the gate electrode 5, an insulating film 9 made from, e.g. a silicon oxide film, is formed. One of diffusion layer 7 of the MOS transistor 2 is connected to a bit line 11 via a plug 10. Upper portion of the MOS transistor 2 is covered with an insulating film 12a for interlaminar insulation such as a BPSG (boron-doped phosphosilicate glass) film, a SOG (spin on glass) film, a silicon oxide film or silicon nitride film formed by a CVD (chemical vapor deposition) method or a sputtering method.

On the insulating film 12a covering the MOS transistor 2, capacitor 3 for storing information are formed, and an insulating film 12b made from, e.g., a silicon oxide film, is formed for interlaminar insulation. The information storing capacitor 3 is connected to a diffusion layer 8 at another side of the MOS transistor 2 via, for example, a plug 13 made of polycrystalline silicon. The information storing capacitor 3 comprises an electroconductive barrier layer 14, a first capacitor electrode 15, a dielectric oxide film 16 having high dielectric constant or ferroelectricity and a second capacitor electrode 17 from the bottom in a laminated structure. The upper portion thereof is covered with an insulating film 18 made from a silicon oxide film for interlaminar insulation.

In the above mentioned structure of the device, one feature of the present invention is in that either one or both of the first capacitor electrode 15 and the second capacitor electrode 17 are formed by (i) at least one element selected from the group consisting of rhodium (Rh), ruthenium (Ru), iridium (Ir), osmium (Os) and platinum (Pt) as a main constituting element or (ii) at least one material selected from the group consisting of ruthenium oxide ($Ru_xO_y$) and iridium oxide ($Ir_xO_y$) as a main constituting material and at least one element selected from the group consisting of palladium (Pd), nickel (Ni), and titanium (Ti) as an adding element in an amount of 10 atom % to 25 atom %. The term "main constituting element" means an element which is contained in the largest amount, and the term "main constituting material" means a material which is contained in the largest amount.

By making the special element the main-constituting element, or making the special material the main constituting material and containing the special adding element in a predetermined amount, the adhesiveness of the first capacitor electrode 15 and the second capacitor electrode 17 to the insulating film 12b and the insulating film 18 can be enhanced remarkably. This is explained in detail below.

The present inventors examined how the adhesive fracture energy between the capacitor electrode film and the insulating film changes by the adding element contained in the capacitor electrode film using molecular dynamic simulation. The molecular dynamic simulation is a method, as disclosed in Journal of Applied Physics, vol. 54, pages 4864–4878, 1983, comprising calculating forces acting on individual atoms through potentials among atoms, and solving the Newton's equation of motion based on the obtained forces to calculate the positions of individual atoms at each time. The adhesive fracture energy U means an energy necessary for causing adhesive fracture between the capacitor electrode film and the insulating film. This is explained, for example, in International Journal of Fracture, vol. 66, pages 45–70, 1994. In the present case, the value U was calculated by subtracting a total of interatomic potentials inside of both systems of the capacitor electrode film and the interlaminar insulating film from a total of interatomic potentials inside of the capacitor electrode film plus a total of interatomic potentials inside of the interlaminar insulation film.

Figure 3:
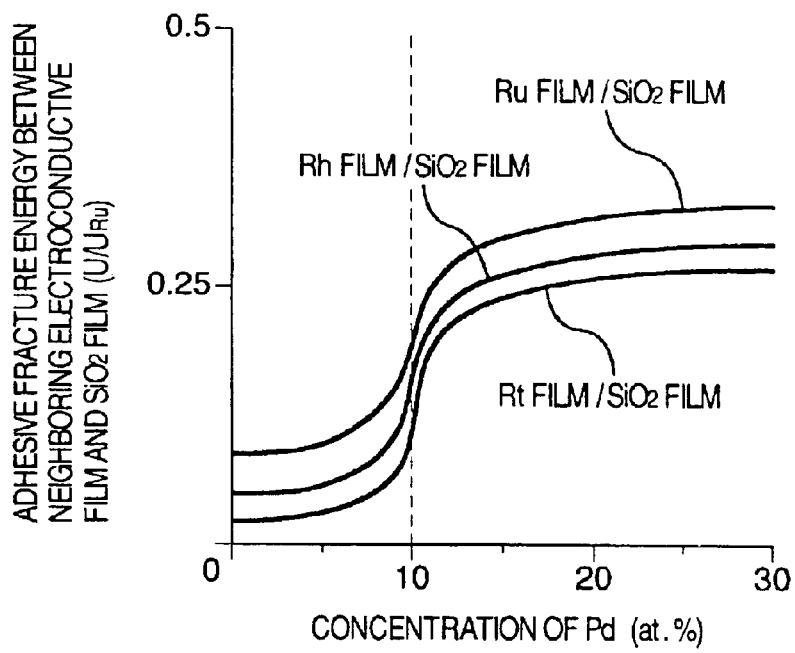
FIG. 3 is a graph showing dependency of adhesive fracture energy between an electrode film and silicon oxide film on palladium concentration when palladium is added as the adding element to the electrode film comprising rhodium, ruthenium and platinum.

As one example, FIG. 3 is a graph showing changes of the adhesive fracture energy against palladium concentrations in the case of simulation wherein a film (capacitor electrode film) containing as a main component rhodium, ruthenium and platinum, respectively, and palladium is formed on a $SiO_2$ film at 900K and cooled to 300K. The ordinate axis of the graph is standardized by the adhesive fracture energy $U_{Ru}$ for the ruthenium film containing no adding element and the ruthenium film. The film thickness was 3 nm for both the capacitor electrode film and the $SiO_2$ film. The adhesive fracture energy means the energy necessary for causing adhesive fracture between the capacitor electrode film and the silicon oxide ($SiO_2$) film. It is clear from FIG. 3 that when the palladium concentration becomes about 10 atom % or more, the adhesive fracture energy increases abruptly to remarkably improve the adhesiveness between the capacitor electrode film and the silicon oxide ($SiO_2$) film.

Figure 4:
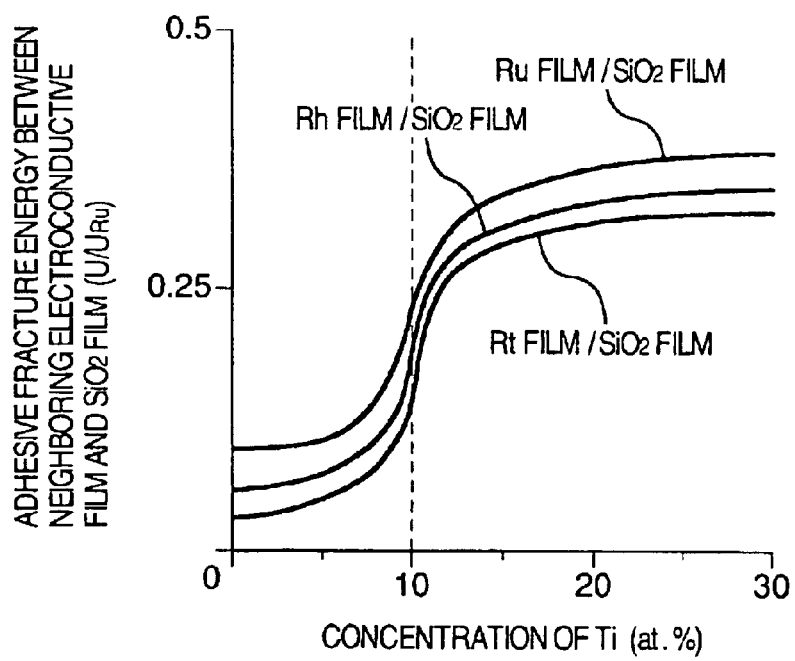
FIG. 4 is a graph showing dependency of adhesive fracture energy between an electrode film and silicon oxide film on titanium concentration when titanium is added as the adding element to the electrode film comprising rhodium, ruthenium and platinum.

Similarly, FIG. 4 shows changes of adhesive fracture energy against the titanium concentration in the case of making the capacitor electrode film using rhodium, ruthenium or platinum as a main constituting element and titanium. As is clear from FIG. 4, when the concentration of adding element of titanium becomes about 10 atom % or more, the adhesive fracture energy increases abruptly to remarkably improve the adhesiveness between the capacitor electrode film and the silicon oxide film. From FIGS. 3 and 4, it becomes clear that when the concentration of adding element becomes about 10 atom %, the adhesive fracture energy increases abruptly to remarkably improve the adhesiveness, but when the concentration of the adding element becomes more than about 15 atom %, almost constant adhesive fracture energy is obtained to mean that the effect for improving adhesiveness is saturated.

Figure 5:
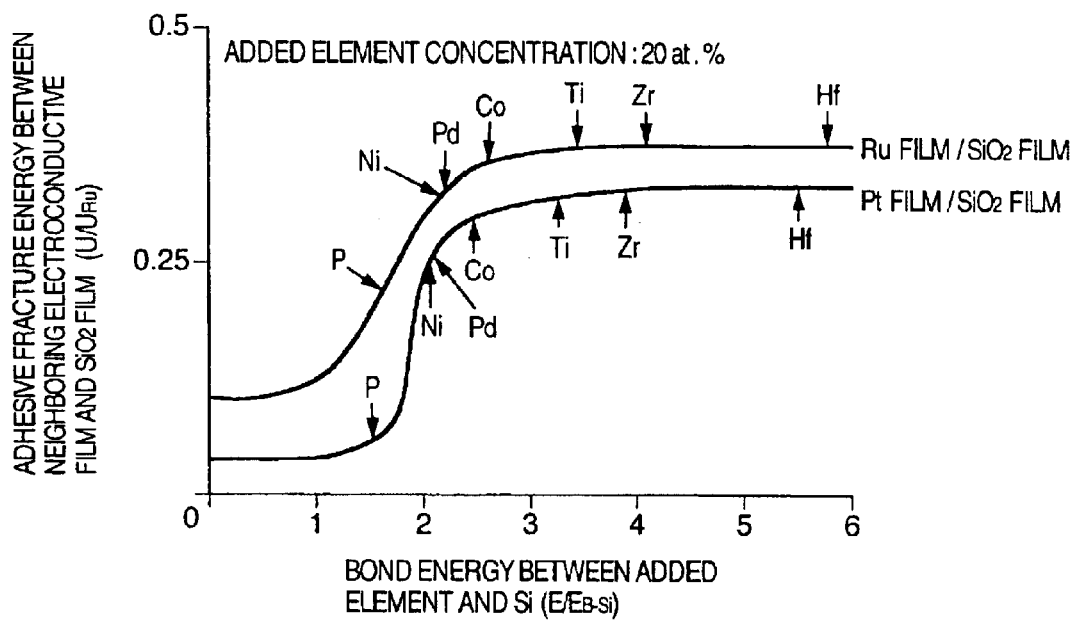
FIG. 5 is a graph showing dependency of adhesive fracture energy between an electrode film and silicon oxide film on the bonding energy between the added element and silicon when the concentration of added element is set at 20 atom %.

Next, which kinds of adding elements improve the adhesiveness with the silicon oxide film was analyzed. As the adding element, palladium, cobalt, nickel, titanium, hafnium (Hf), zirconium (Zr) and phosphorus (P) in adding concentration of 20 atom % was examined. Adhesive fracture energy of ruthenium electrode film containing an adding element and platinum electrode film against the silicon oxide film, respectively, was examined and at the same time the relation of each adding element to bond energy to silicon was also examined. The results are shown in FIG. 5, wherein the ratio of $E/E_{B-Si}$ is taken along the abscissa axis and the adhesive fracture energy of the electrode film to the silicon oxide film is taken along the ordinate axis. In the above, E means bond energy between an adding element and silicon, and $E_{B-Si}$ means bond energy between the main constituting element in the electrode film (ruthenium or platinum) and silicon. As shown in FIG. 5, it is understood that when the bond energy of the adding element to silicon is 2 times or more as large as the bond energy between the main constituting element of the capacitor electrode film and silicon, the adhesiveness between the capacitor electrode film and the silicon oxide film is particularly improved. Concretely, palladium, cobalt, nickel, titanium, hafnium and zirconium are effective for improving the adhesiveness.

The kind of adding element effective for improving the adhesiveness becomes clear as mentioned above. Another problem is when these adding elements are contained in the electrode film, if the formation of perovskite crystal structure of the oxide film material dielectric such as BST, PZT, etc. becomes impossible on the electrode film due to disturbance of atomic arrangement in the electrode film, exhibition of a function of BST, PZT, etc. as ferroelectric substance or high dielectric substance becomes impossible. Thus, a molecular dynamic simulation for specifying an adding element which does not disturb atomic arrangement of the electrode film was conducted.

Figure 6:
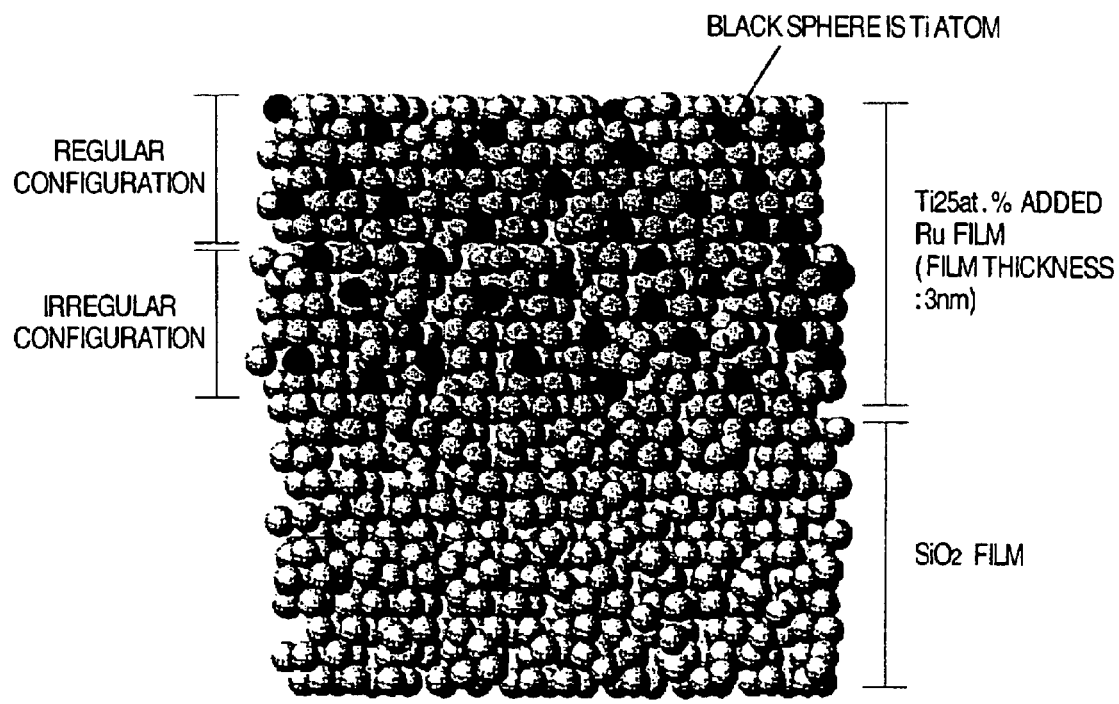
FIG. 6 is a drawing showing atomic configuration at an equilibrium state when simulation of formation of ruthenium capacitor electrode containing 25 atom % of titanium on $SiO_2$ is conducted.

FIG. 6 is a drawing showing atomic arrangement or configuration in equilibrium state when simulation was conducted by forming a capacitor electrode film containing ruthenium as a main constituting element and titanium in an amount of 25 atom % as an adding element on a silicon oxide film at 900 K, followed by cooling to 300 K. The film thickness of the capacitor electrode film and the silicon oxide film was 3 nm. As shown in FIG. 6, the atomic configuration of the capacitor electrode film is disturbed irregularly near the interface, but the upper layer is are ranged regularly. When the oxide film material having the perovskite crystal structure is formed on the electrode film having such an atomic configuration, there is no problem.

Figure 7:
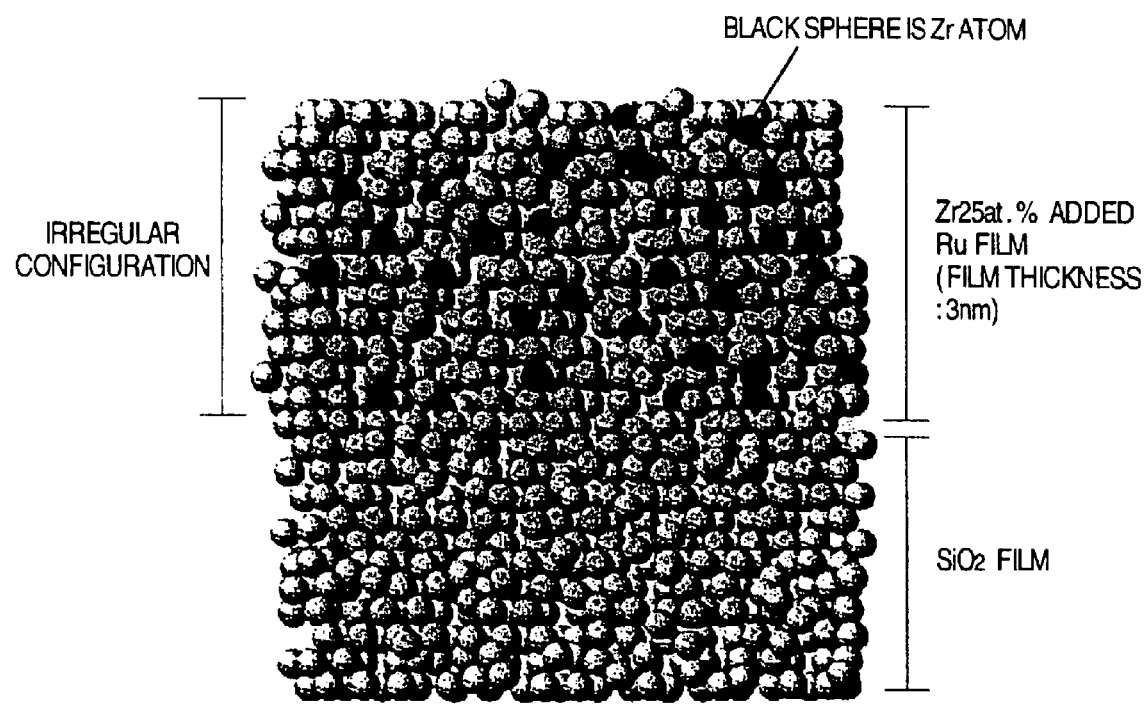
FIG. 7 is a drawing showing atomic configuration at an equilibrium state when simulation of formation of ruthenium capacitor electrode containing 25 atom % of zirconium on $SiO_2$ is conducted.

When simulation was conducted by forming a capacitor electrode film containing ruthenium as a main constituting element and zirconium in an amount of 5 atom % as an adding element on a silicon oxide film at 900 K, followed by cooling to 300 K, the results are as shown in FIG. 7. In this case, each film thickness was made 3 nm. From FIG. 7, it is clear that when zirconium is added, the atomic configuration of the capacitor electrode film become irregular in the whole film, and formation of the perovskite crystal structure on the electrode film having such a disturbed atomic configuration becomes difficult.

Similarly, when simulation was conducted by forming a capacitor electrode film containing ruthenium as a main constituting element and hafnium in an amount of 25 atom % on a silicon oxide film at 900 K, followed by cooling to 300 K, the atomic configuration of the electrode film was disturbed irregularly in the same manner as the case of using zirconium as the adding element.

A reason for causing disturbance of atomic configuration of the electrode film when zirconium or hafnium is used as the adding element in the electrode film seems to be a large difference in the atomic radius of the main constituting element of electrode film and the atomic radius of the adding element. In fact, the difference between the atomic radius of ruthenium and the atomic radius of titanium is about 5%, while the difference between the atomic radius of zirconium or hafnium and the atomic radius of ruthenium is as large as about 19% or about 18%.

The present inventors have further studied based on the above facts and found that when the difference between the atomic radius of main constituting element and that of the adding element is over 10%, there easily brings about in the electrode film disturbance of atomic configuration which damages the formation of perovskite crystal structure of the oxide film material on the electrode film.

From the above-mentioned results of the study of the present inventors, the following things becomes clear. That is, among palladium, cobalt, nickel, titanium hafnium and zirconium which are effective for improving the adhesiveness, hafnium and zirconium cause undesirable disturbance of atomic configuration in the capacitor electrode film. Therefore, palladium, cobalt, nickel and titanium are effective as the adding element.

When the content of the adding element in the capacitor electrode film becomes excess, it is possible to bring about undesirable disturbance in the atomic configuration. Therefore, molecular dynamic simulation for specifying the content of adding element not disturbing the atomic configuration in the electrode film was conducted.

FIG. 6 shows the case of forming a capacitor electrode film containing ruthenium as a main constituting element and titanium in an amount of 25 atom % as the adding element on a silicon oxide film. As shown in FIG. 6, the atomic configuration of capacitor electrode film near interface disturbs irregularly, while the upper layer is arranged regularly. The formation of perovskite crystal structure of dielectric material on the electrode film having such an atomic configuration has no problem as mentioned above.

Figure 8:
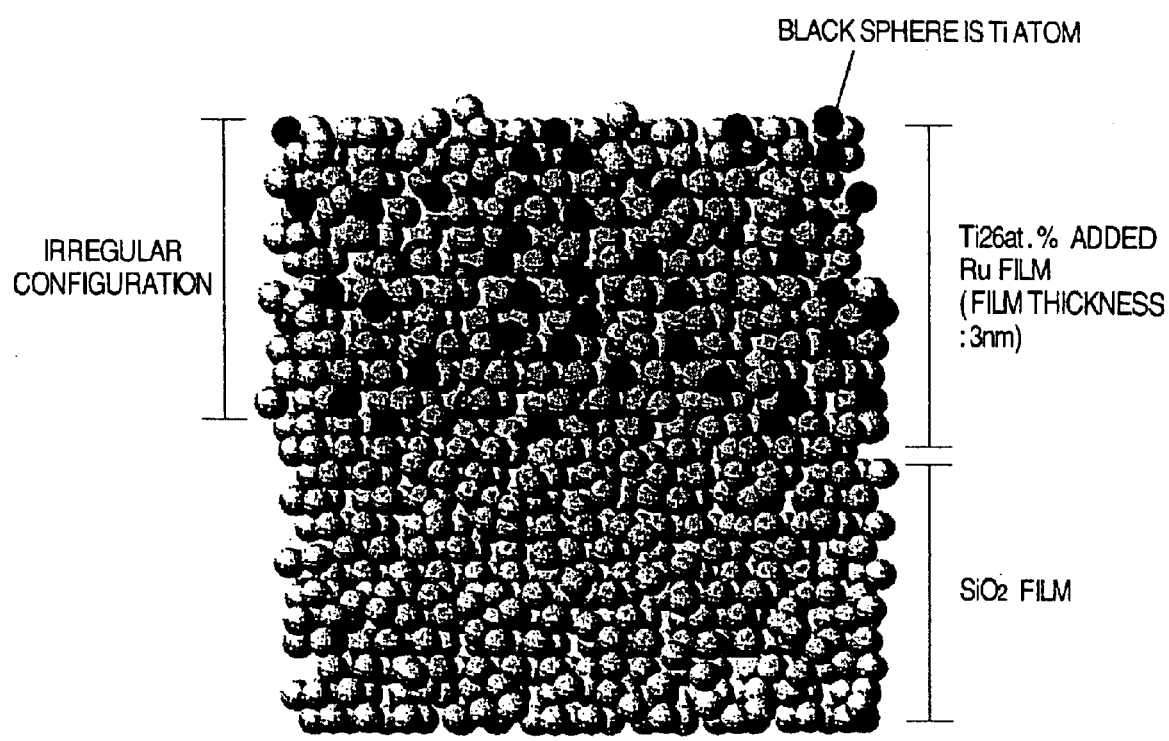
FIG. 8 is a drawing showing atomic configuration at an equilibrium state when simulation of formation of ruthenium capacitor electrode containing 26 atom % of titanium on $SiO_2$ is conducted.

In contrast, when a simulation is conducted by forming a capacitor electrode film (film thickness 3 nm) containing ruthenium as a main constituting element and titanium in an amount of 26 atom % as adding element on a silicon oxide film (film thickness 3 nm) at 900 K, followed by cooling to 300 K, the results are as shown in FIG. 8. As shown in FIG. 8, the atomic configuration of capacitor electrode film is irregular in whole film. Thus, it becomes difficult to form perovskite crystal structure of oxide film material on the electrode film having such an atomic configuration.

In the same manner as mentioned above, the simulation was conducted by using palladium, cobalt or nickel as the adding element. As a result, it was found that when the content of the adding element is 25 atom % or less, the perovskite crystal structure of oxide film material can be formed stably on the electrode film without producing undesirable disturbance in crystal structure of atomic configuration in the electrode film. Further, when a plurality of elements were contained in the electrode film as adding elements, the same results were obtained. In addition, when rhodium, iridium, osmium and platinum were used in place of ruthenium as the main constituting element, the same results were obtained. From the above results, it can be understood that the content of 25 atom % of adding element means a critical value.

In order to improve the adhesiveness of the capacitor electrode to the silicon oxide film, there can be required the following factors considering the above facts. First, as a factor for improving the adhesiveness, the bond energy between the adding element and silicon and the content of adding element. As to the bond energy between the adding element and silicon, it is required to be 2 times or more as large as the bond energy between the main constituting element in the capacitor electrode and silicon. On the other hand, the content of adding element is required to be about 10 atom % or more.

Next, as a factor for not producing undesirable disturbance in the crystal structure in the capacitor electrode film, there are the atomic radius of adding element and the content of adding element. The atomic radius of adding element is required to be not exceeding 10% in the difference compared with the atomic radius of the main constituting element of the capacitor electrode film. That is, the adding element is required to have the bond energy to silicon of 2 times or more as large as the bond energy between the main constituting element and silicon, and to have the atomic radius of 10% or less in difference compared with the atomic radius of the main constituting element. As the elements satisfying the above factors, there can be recited palladium, nickel, cobalt and titanium. The adding amount of these adding elements is about 10 atom % to about 25 atom %.

In the above, explanation was made as to the case of using at least one element selected from rhodium, ruthenium, iridium, osmium and platinum as the main constituting element for forming the capacitor electrode, but according to the stud of the present inventors, the same results as mentioned above were also obtained when at least one electroconductive material selected from ruthenium oxide and iridium oxide was used as the main constituting material.

Next, steps for producing main part of DRAM shown in FIG. 1 are explained by using FIG. 9 to FIG. 12.

Figure 9:
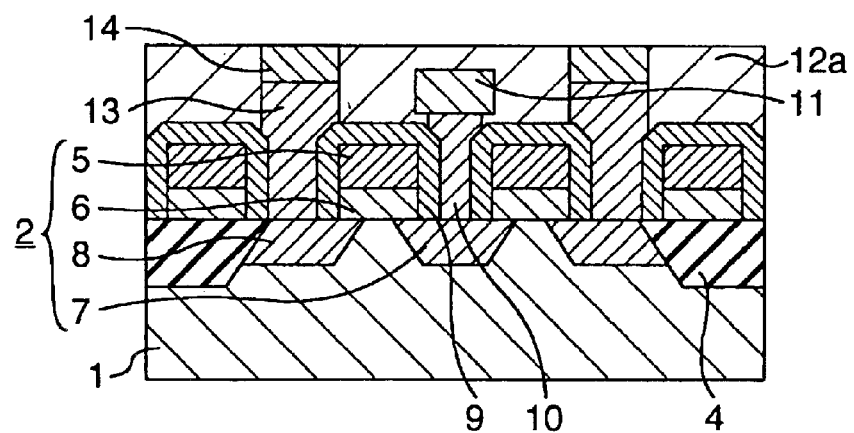
FIG. 9 is a cross-section view showing production step for the main part of the semiconductor device of Example 1.
Figure 10:
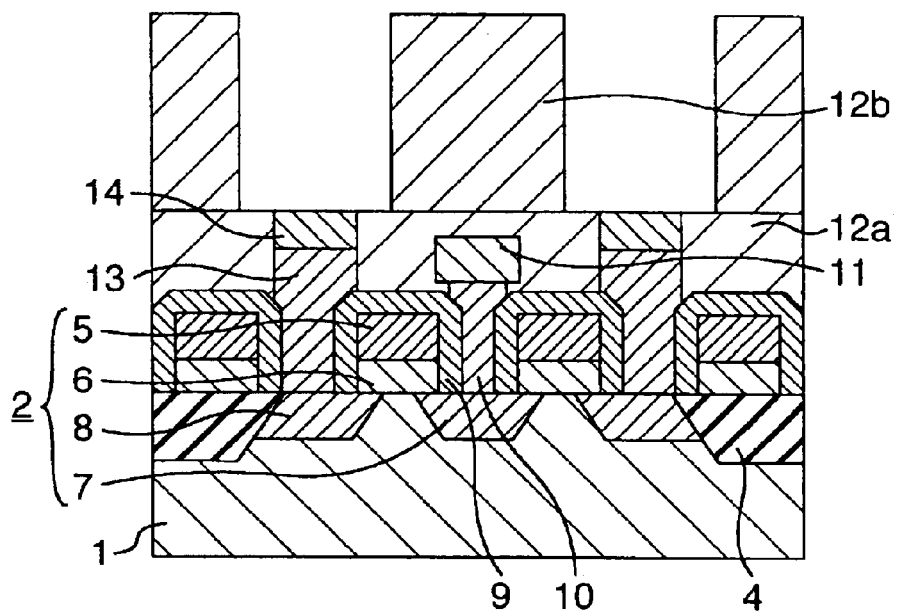
FIG. 10 is a cross-section view showing production step for the main part of the semiconductor device of Example 1.
Figure 11:
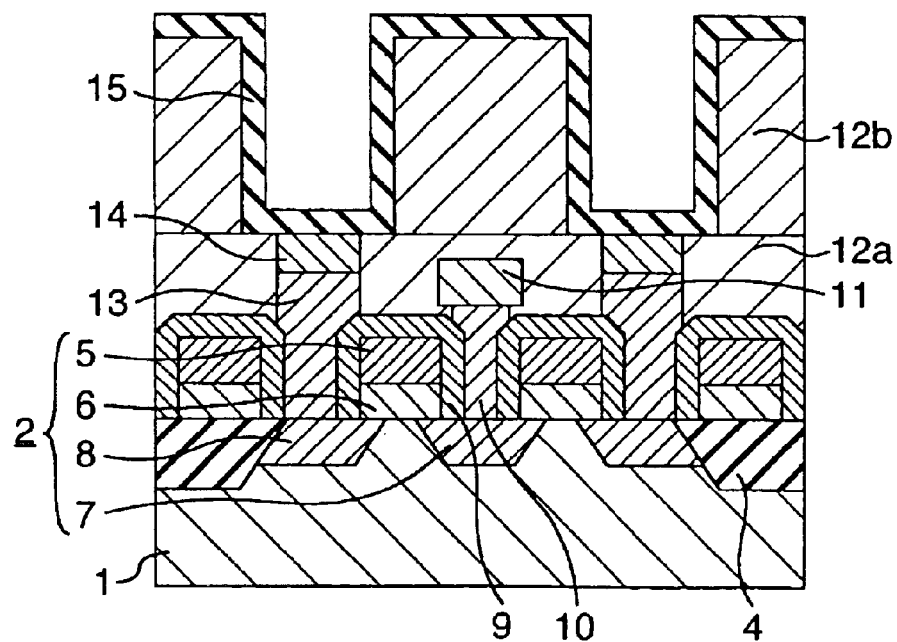
FIG. 11 is a cross-section view showing production step for the main part of the semiconductor device of Example 1.

As shown in FIG. 9, on a silicon substrate 1, an element separation film 4, a transistor 2, an insulating film 9, a plug 10, a plug 13, a bit line 11, an insulating film 12a, and an electroconductive film 14 are formed by a conventional process, followed by flattening of surfaces of the insulating film 12a and electroconductive film 14 by a chemical mechanical polishing (CMP) method, etc. On the surfaces of the insulating film 12a and electroconductive film 14, $SiO_2$ or the like film is deposited by a CVD method or the like, and trenches for forming a capacitive cell are formed by etching or the like to form an insulating film 12b (FIG. 10). Subsequently, on the surfaces of the insulating film 12a, the electroconductive film 14 and the insulating film 12b, a film 15a for a first capacitor electrode film 15 is formed using ruthenium or ruthenium alloy containing titanium in a concentration between 10 atom % and 25 atom % as the adding element by a sputtering method, a CVD method, a plating method, a vapor deposition method, or the like (FIG. 11). In this case, the sputtering method has an advantage of showing better adhesiveness of the formed film 15a to the insulating films. On the other hand, the CVD method has an advantage of giving more uniform film thickness of the formed film 15a at the side walls and the bottom of the trenches for forming the capacitor cell (the portions finally forming the first capacitor electrode film 15). As the adding element for the film 15a, there can be used palladium, nickel, or cobalt in place of titanium. As the main constituting element for the film 15a, there can be used rhodium, iridium, osmium or platinum in place of ruthenium or ruthenium alloy. Further, either ruthenium oxide or iridium oxide can also be used.

Figure 12:
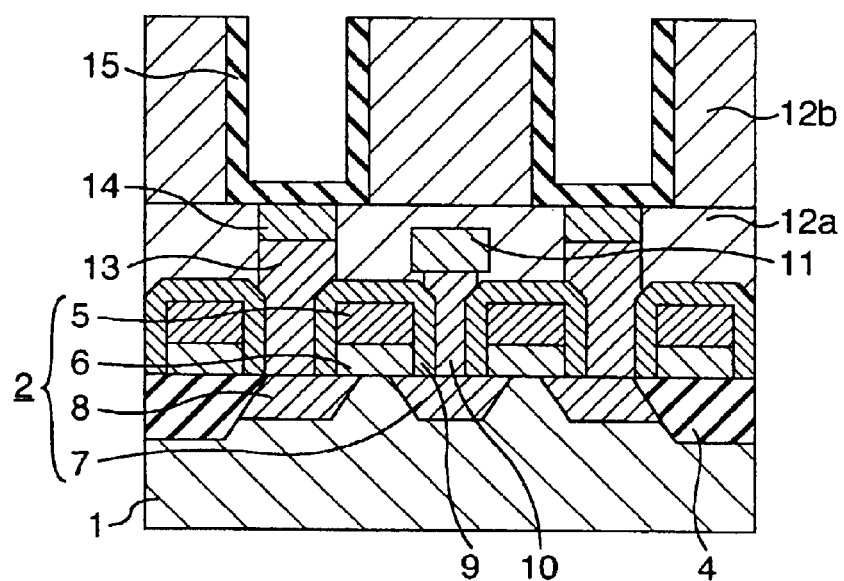
FIG. 12 is a cross-section view showing production step for the main part of the semiconductor device of Example 1.

Then, extra portions formed except for the trenches are removed from the film 15a by, e.g. a CMP method, to form an under electrode film (first capacitor electrode film 15) (FIG. 12). In this step, when the adhesiveness of the film 15a to the insulating film 12b is low, there is a possibility of causing a trouble of peeling of the film 15a from the insulating film 12b. But according to the present invention, since as the adding element there is contained titanium in a concentration of 10 to 25 atom %, or palladium, nickel or cobalt in place of titanium in a concentration of 10 to 25 atom %, the adhesiveness between the film 15a and the insulating film 12b is improved remarkably. Thus, in the step of removing partly the film 15a by the CMP method or the like, it is possible to effectively prevent a problem of peeling of the film 15a (the first capacitor electrode film 15) which is to be retained from the insulating film 12b. Further, in the subsequent steps, the effect of the present invention of having excellent adhesiveness between the first capacitor electrode film 15 and the insulating film 12b can function effectively.

Subsequently, on the first capacitor electrode film 15 and the insulating film 12b for interlaminar insulation, a capacitor dielectric film (oxide film) 16 is formed by using a dielectric material such as barium strontium titanate (Ba, Sr) $TiO_3$: BST), zirconium lead titanate (Pb(Zr, Ti)$O_3$: PZT), etc. by a sputtering method, a CVD method, or laser abrasion method. Then, on the oxide film 16, an upper electrode film (second capacitor electrode film 17) is formed by using ruthenium or ruthenium alloy containing titanium as adding element in a concentration of 10 to 25 atom % by a sputtering method, a CVD method, or a vapor deposition method. As to the second capacitor electrode film 17, there can be used as the adding element palladium, nickel or cobalt in place of titanium. As the main constituting element or main constituting material, there can be used rhodium, iridium, osmium, or platinum in place of ruthenium or ruthenium alloy, as well as ruthenium oxide or iridium oxide. Finally, on the upper electrode film, an insulating film such as $SiO_2$ or the like film is deposited to obtain the structure of main part of DRAM as shown in FIG. 1. After this, the steps are completed in the same manner as conventional steps for producing DRAM.

EXAMPLE 2

Figure 13:
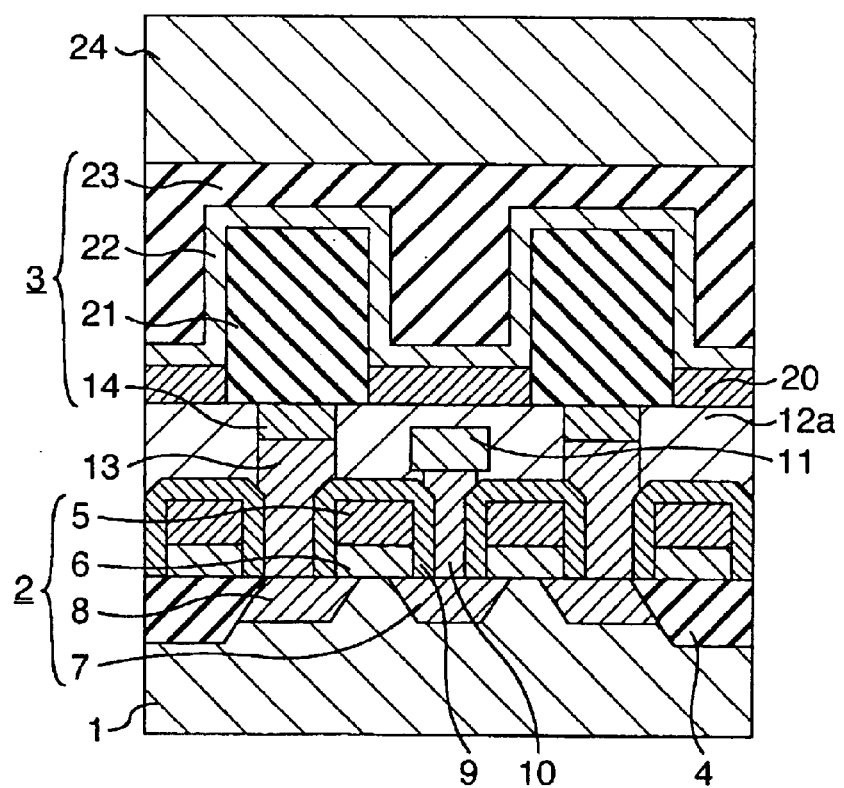
FIG. 13 is a cross-sectional view showing the main part of the semiconductor device of Example 2.

FIG. 13 is a cross-sectional view showing the structure of main part of DRAM, a semiconductor device. In FIG. 13, the same numerals as in FIG. 1 have the same meaning. The semiconductor device of this Example has a MOS type transistor 2 formed in the active region of the main surface of the silicon substrate 1 and an information storage capacitor 3 on the upper portion thereof.

The MOS transistor 2 for memory cell selection comprises a gate electrode 5, a gate insulating film 6 and diffusion layers 7 and 8. The gate insulating film 6 is made from, for example, a silicon oxide film, a silicon nitride film, a ferroelectric film, or a laminated structure thereof. The gate electrode 5 is made from, for example, a polycrystalline silicon film, a metal thin film, a metal silicide film, or a laminated structure thereof. On the upper portion and side portions of the gate electrode 5, an insulation film 9 made from, for example, a silicon oxide film is formed. One of the diffusion layer 7 of the MOS transistor 2 is connected to a bit line 11 via a plug 10. The upper portion of the MOS transistor 2 is covered by an insulating film 12a for interlaminar insulation made from, for example, a BPSG film, a SOG film, or a silicon oxide film or a silicon nitride film formed by a CVD method or a sputtering method.

On the upper portion of the insulating film 12a covering the MOS transistor 2, an information storage capacitor 3 is formed. The information storage capacitor 3 is connected to another diffusion layer 8 via a plug 13 made of, for example, polycrystalline silicon. The information storage capacitor 3 comprises an electroconductive barrier film 14, an insulating film 20 for interlaminar insulation made of, for example, silicon oxide film, a first capacitor electrode 21, an oxide film 22 for dielectric having high dielectric constant or ferroelectricity and a second capacitor electrode 23 in a laminated structure, the upper portion of which is covered with an insulating film 24 made from a silicon oxide film for interlaminar insulation.

In this Example, the first capacitor electrode 21 or the second capacitor electrode 23 or both of them is composed of the following composition. That is, at least one of the first capacitor electrode and the second capacitor electrode is made of at least one element selected from the group consisting of rhodium, ruthenium, iridium, osmium and platinum as the main constituting element, or ruthenium oxide or iridium oxide as the main constituting material, and at least one element selected from the group consisting of palladium, nickel, cobalt and titanium as the adding element in a concentration of 10 to 25 atom %.

Figure 14:
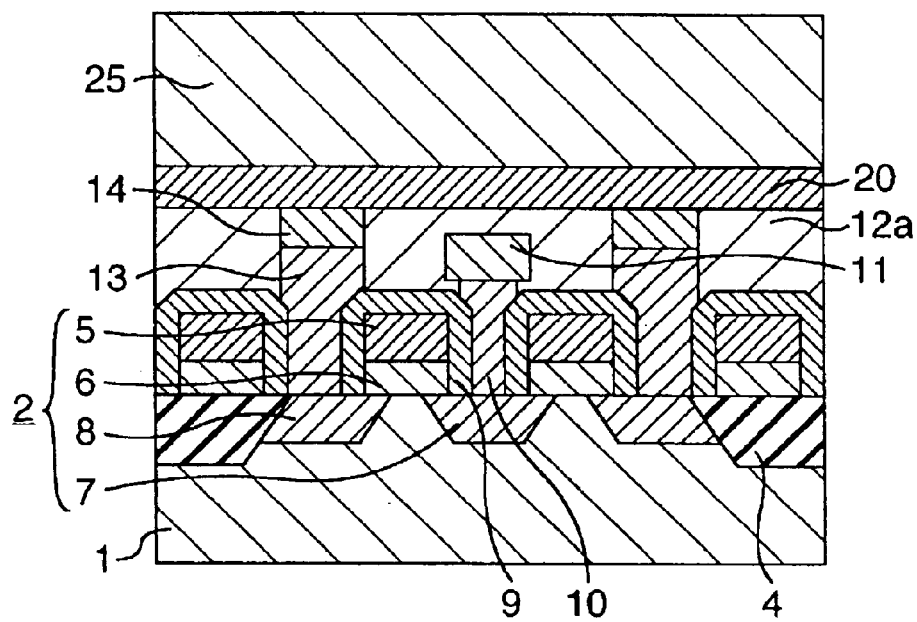
FIG. 14 is a cross-section view showing production step for the main part of the semiconductor device of Example 2.
Figure 15:
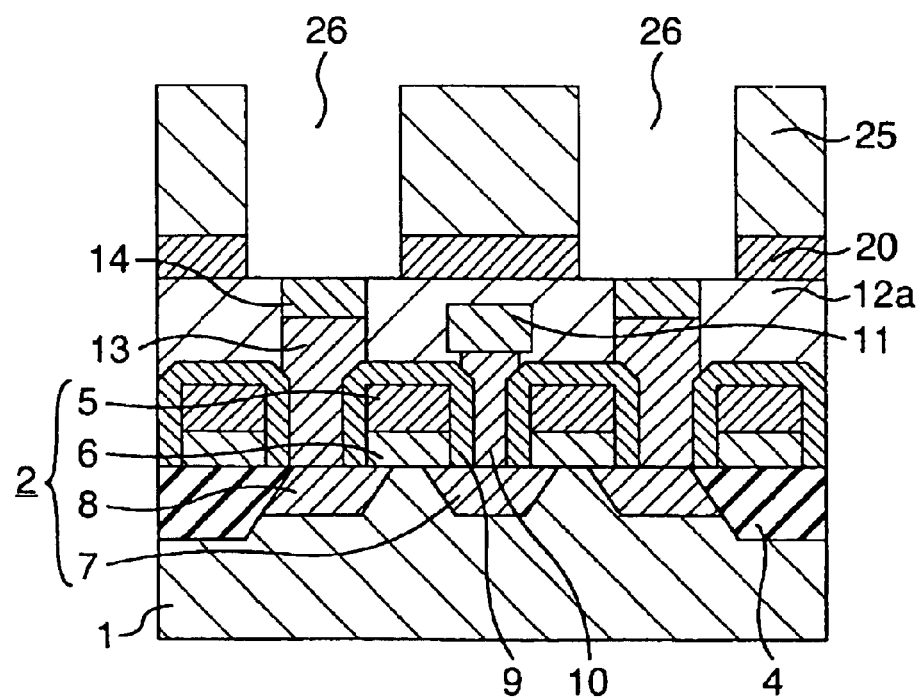
FIG. 15 is a cross-section view showing production step for the main part of the semiconductor device of Example 2.

A process for producing the main portions of DRAM shown in FIG. 13 is explained referring to FIGS. 14 to 17. First, as shown in FIG. 14, on a silicon substrate 1, an element separation film 4, a transistor 2, an insulating film 9, a plug 10, a plug 13, a bit line 11, an insulating film 12a, and an electroconductive film 14 are formed by a conventional method, followed by flattening of the surfaces of the insulating film 12a and the electroconductive film 14. Then, on the surfaces of the insulating film 12a and the electroconductive film 14, an insulating film 20 is formed by using SiN$_4$, etc. by a CVD method or the like. Further, an insulating film 25 is deposited thereon by using SiO$_2$ or the like (FIG. 14). Then, a trench 26 for forming a capacitive cell is formed by etching the insulating film 20 and the insulating film 25 (FIG. 15). Then, on the surfaces of the trench 26 and the insulating film 25, a film of ruthenium or ruthenium alloy containing as the adding element titanium in a concentration of 10 to 25 atom % is formed by a sputtering method, a CVD method or a vapor deposition method. Here, as the adding element to the above film, there can be used palladium, nickel or cobalt in place of titanium. Further, as the main constituting element, there can be used rhodium, iridium, osmium or platinum in place of ruthenium or ruthenium alloy, as well as ruthenium oxide or iridium oxide.

Figure 16:
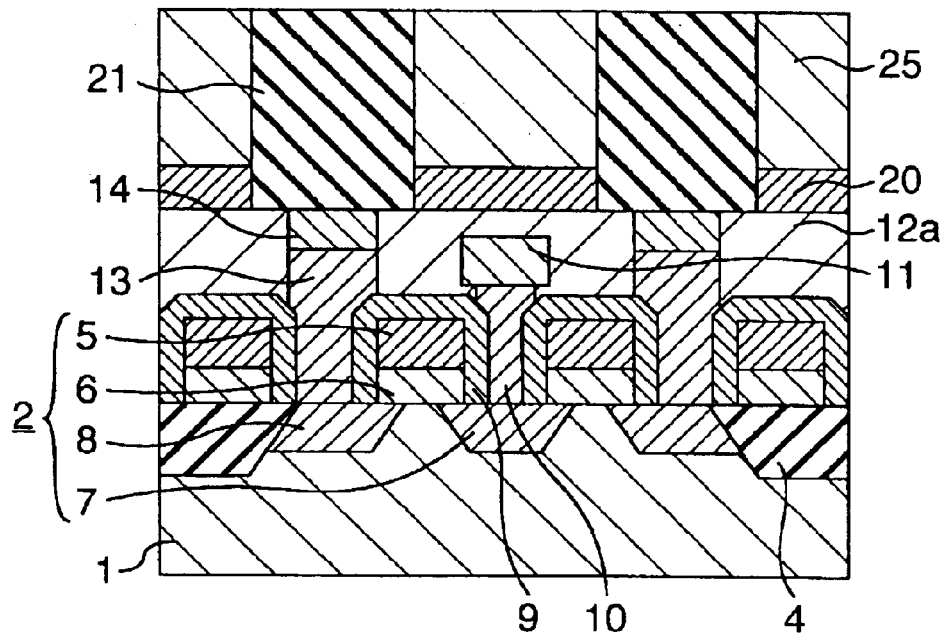
FIG. 16 is a cross-section view showing production step for the main part of the semiconductor device of Example 2.

Then, extra film formed on portions except for the trench 26 is removed by, for example, CMP or the like to form a lower electrode film (first capacitive electrode 21) (FIG. 16). In this step, when the adhesiveness between the film for lower electrode and the insulating film 25 is low, there is a possibility of causing a trouble of peeling of this film from the insulating film 25. But in the present invention, since the film for lower electrode contains titanium or the like in a concentration of 10 to 25 atom %, the adhesiveness between this film and the insulating film 25 is improved remarkably. Therefore, the peeling of the lower electrode film, which should be retained in the partial removing step of the film for lower electrode by a CMP method or the like, from the insulating film 25 can effectively be prevented.

Figure 17:
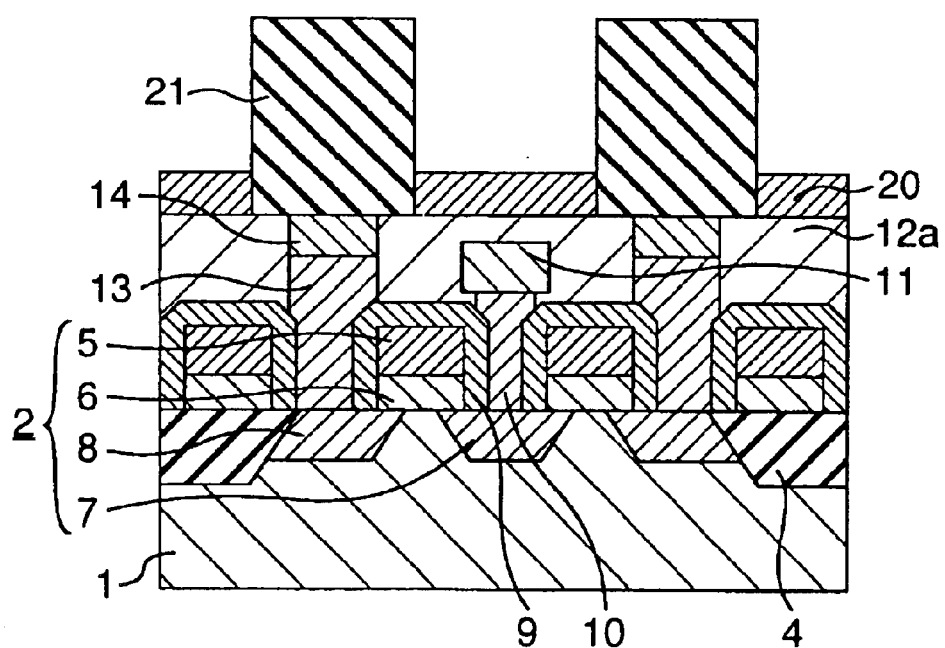
FIG. 17 is a cross-section view showing production step for the main part of the semiconductor device of Example 2.

Subsequently, the insulating film 25 is removed by etching or the like to expose the first capacitor electrode 21 (FIG. 17). On the exposed surface of first capacitor electrode 21, a capacitor dielectric film (oxide film 22) is formed by using a dielectric material such as BST, PZT, or the like by a sputtering method, a CVD method, or a laser abrasion method. Then, on the capacitor dielectric film, an upper electrode film (second capacitor electrode film 23) is formed by using ruthenium or ruthenium alloy containing titanium as the adding element in a concentration of 10 to 25 atom % by a sputtering method, a CVD method, or a vapor deposition method. As the second capacitor electrode film 23, there can also be used as the adding element palladium, nickel, or cobalt in place of titanium. As the main constituting element or main constituting material, there can be used rhodium, iridium, osmium, or platinum in place of ruthenium or ruthenium alloy, as well as ruthenium oxide or iridium oxide. Finally, on the upper electrode film, an insulating film such as SiO$_2$, or the like is deposited to give the structure of main part of DRAM as shown in FIG. 13. Thereafter, conventional steps are carried out to produce DRAM completely.

The finally formed first capacitor electrode 21 in the semiconductor device (DRAM) of this Example has a small area contacting with the interlaminar insulating film (insulating film 20) as shown in FIG. 13. On the other hand, the first capacitor electrode 21 contacts with the insulating film 25 in a broader area during the production steps as shown in FIG. 16. Thus, adhesiveness between the insulating film 25 and the first capacitor electrode 21 becomes important. From this reason, to form the first capacitor electrode 21 by using the above-mentioned material is effective for enhancing the adhesiveness between the first capacitor electrode 21 and the insulating film 25.

In the above-mentioned Examples 1 and 2, palladium, nickel, cobalt and titanium were treated equally as the adding element. But, according to the study of the present inventors, it is found that titanium and nickel are particularly excellent. That is, in order to improve the adhesiveness, titanium is the most effective, and when heat treatment is conducted in an oxygen atmosphere, the most excellent adding element in electrical stability is nickel. From these results, it is more preferable to use titanium or nickel as the adding element.

EXAMPLE 3

Figure 18:
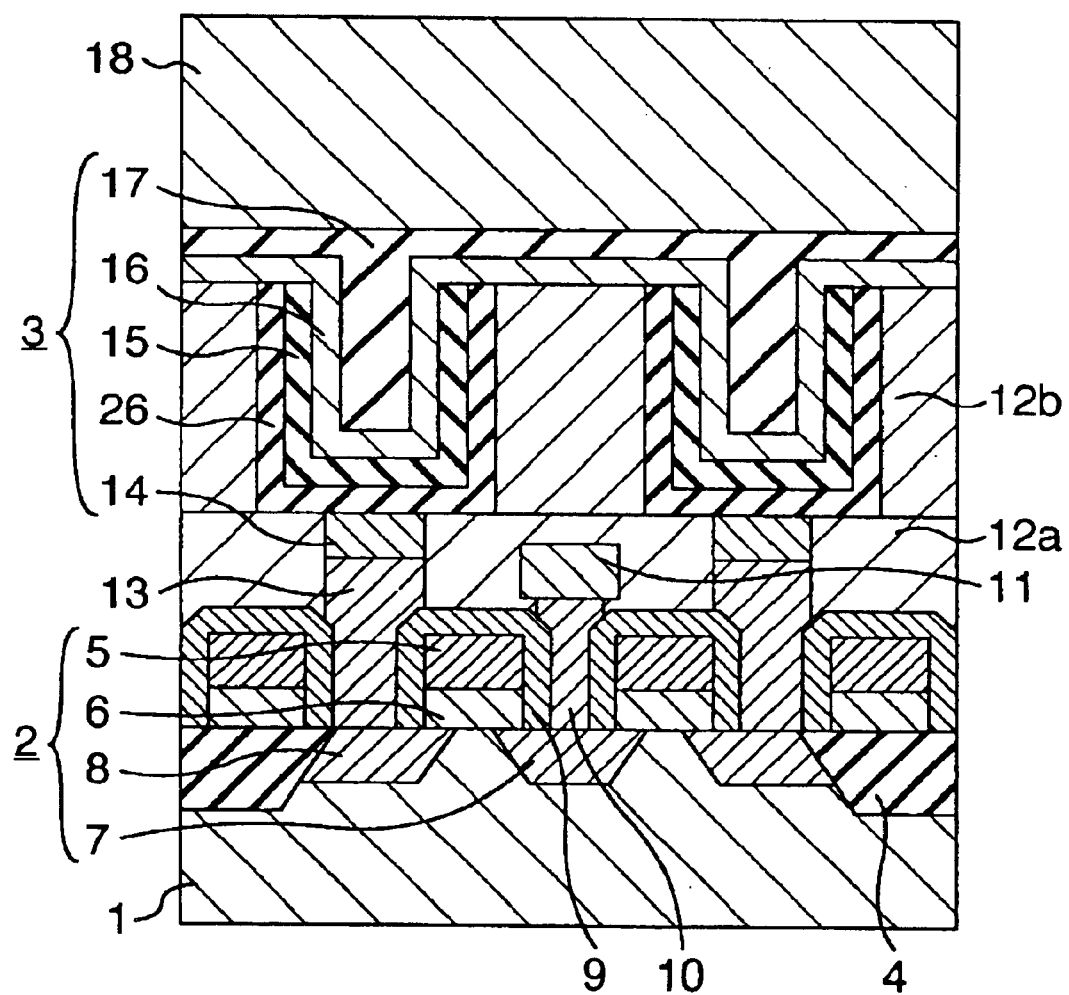
FIG. 18 is a cross-sectional view showing major portions for the main part device of Example 3.

FIG. 18 is a cross-sectional view of the structure of main part of the semiconductor device (DRAM) of Example 3. In FIG. 18, the same numerals as used in FIG. 1 have the same meaning as in FIG. 1. A major difference between the semiconductor device of Example 3 and that of Example 1 is the presence of a sticking layer 26 between the insulating film 12b and the first capacitor electrode 15. The sticking layer 26 is an electroconductive film containing one element selected from palladium, nickel, cobalt and titanium as the main constituting element. Since these elements have larger bond energy for silicon, the sticking layer 26 shows high adhesiveness to the insulating film 12b. Therefore, in the structure having the sticking layer 26, the first capacitor electrode 15 not always requires an adding element.

As a result, in this Example, the first capacitor electrode 15 can be formed from (i) only one element selected from the group consisting of rhodium, ruthenium, iridium, osmium, and platinum, (ii) a main constituting element being selected from these elements mentioned in (i) and an adding element in an amount smaller than that in Example 1, (iii) only one material selected from ruthenium oxide and iridium oxide, and (iv) a main constituting element being selected from these materials mentioned in (iii) and an adding element in an amount smaller than that in Example 1. By taking such a structure, not only the peeling problem of the first capacitor electrode 15 can effectively be avoided by the presence of the sticking layer 26, but also the disturbance of atomic rearrangement in the first capacitor electrode 15 can be reduced remarkably, resulting in more enhancing the stability of the oxide film 16.

In this Example, the electroconductive film (sticking layer 26) is formed only as to the first capacitor electrode 15. But, it is also possible to form the electroconductive film as to the second capacitor electrode 17 between the insulating film 18 and the second capacitor electrode 17. The adhesiveness to the insulating film is particularly important in the case of the first capacitor electrode 15. Thus, the embodiment of providing the electroconductive film only for the first capacitor electrode 15 is explained as a typical example.

EXAMPLE 4

Figure 19:
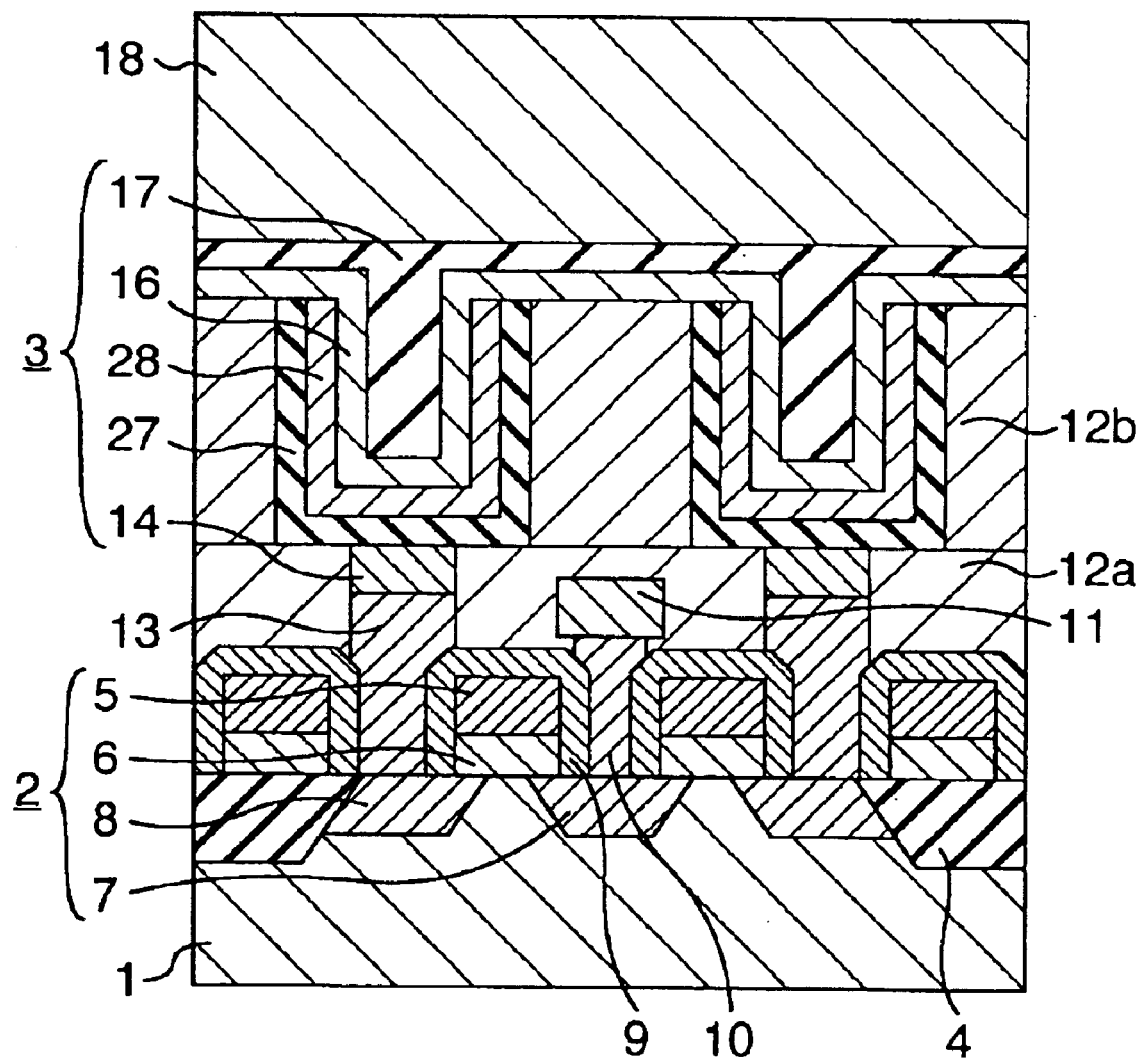
FIG. 19 is a cross-sectional view showing the main part of the semiconductor device of Example 4.

FIG. 19 is a cross-sectional view of a structure of main part of a semiconductor device (DRAM) of Example 4. In FIG. 19, the same numerals as used in FIG. 1 have the same meaning as in FIG. 1. A major difference between the semiconductor device of Example 4 and that of Example 1 is that the first capacitor electrode comprises two electrode films 27 and 28. The electrode film 27 at a side contacting with the insulating film 12b is made of one element selected from the group consisting of rhodium, ruthenium, iridium, osmium and platinum as a main constituting element or one material selected from the group consisting of ruthenium oxide and iridium oxide as a main constituting material together with one element selected from the group consisting of palladium, nickel, cobalt and titanium as an adding element in a concentration of 10 to 25 atom % in order to enhance the adhesiveness to the insulating film 12b.

On the other hand, the electrode film 28 at a side contacting with the oxide film 16 does not always contain an adding element due to not contacting with the insulating film 12*b*. Thus, the electrode film 28 is made from (i) only one element selected from the group consisting of rhodium, ruthenium, iridium, osmium, and platinum, (ii) a main constituting element being selected from these elements mentioned in (i) and an adding element in an amount smaller than that in the electrode film 27, (iii) only one material selected from ruthenium oxide and iridium oxide, and (iv) a main constituting element being selected from these materials mentioned in (iii) and an adding element in an amount smaller than that in the electrode film 27.

By taking such a structure, the same effects as Example 3 are obtained. That is, the adhesiveness to the insulating film 12*b* is sufficiently secured by the electrode film 27 on one hand, and the stability of the oxide film 16 can further be enhanced by making the disturbance of atomic rearrangement in the electrode film 28 lesser.

As to the structure in Example 4, it is possible to make the number of layers of the first capacitor electrode three or more. For example, between the electrode film 28 and the oxide film 16, it is possible to interpose another layer more excellent in control of crystal structure in the oxide film 16. Further, in this example, only the first capacitor electrode is made in a multilayer structure, but it is also possible to make the second capacitor electrode a multilayer structure.

As explained above, according to the present invention, a problem of adhesiveness between the capacitor electrode film and the insulating film caused by higher integration of semiconductor devices equipped with information storage capacitor can be solved and the semiconductor devices with higher reliability can be provided.

What is claimed is:

1. A semiconductor device equipped with a capacitor for storing information comprising an oxide film formed between a first capacitor electrode and a second capacitor electrode, and an insulating film containing silicon as a main constituting element being formed for insulating the first capacitor electrode and the second capacitor electrode, wherein an electroconductive film containing as a main constituting element at least one element selected from the group consisting of palladium, nickel, cobalt and titanium is formed between the first capacitor electrode or the second capacitor electrode and the insulating film, and the first capacitor electrode or the second capacitor electrode is formed from at least one element selected from the group consisting of rhodium, ruthenium, iridium, osmium and platinum as a main constituting element.

2. A semiconductor device equipped with a capacitor for storing information comprising an oxide film formed between a first capacitor electrode and a second capacitor electrode, and an insulating film containing silicon as a main constituting element being formed for insulating the first capacitor electrode and the second capacitor electrode, wherein an electroconductive film containing as a main constituting element at least one element selected from the group consisting of palladium, nickel, cobalt and titanium is formed between the first capacitor electrode or the second capacitor electrode and the insulating film, and the first capacitor electrode or the second capacitor electrode is formed from ruthenium as a main constituting element.

3. A semiconductor device equipped with a capacitor for storing information comprising an oxide film formed between a first capacitor electrode and a second capacitor electrode, and an insulating film containing silicon as a main constituting element being formed for insulating the first capacitor electrode and the second capacitor electrode, wherein an electroconductive film containing as a main constituting element titanium is formed between the first capacitor electrode or the second capacitor electrode and the insulating film, and the first capacitor electrode or the second capacitor electrode is formed from ruthenium as a main constituting element.

4. A semiconductor device equipped with a capacitor for storing information comprising an oxide film formed between a first capacitor electrode and a second capacitor electrode, and an insulating film containing silicon as a main constituting element being formed for insulating the first capacitor electrode and the second capacitor electrode, wherein an electroconductive film containing as a main constituting element at least one element selected from the group consisting of palladium, nickel, cobalt and titanium is formed between the first capacitor electrode or the second capacitor electrode and the insulating film, and the first capacitor electrode or the second capacitor electrode is formed from at least one material selected from the group consisting of ruthenium oxide and iridium oxide as a main constituting material.

5. A semiconductor device equipped with a capacitor for storing information comprising a substrate, a first capacitor electrode formed on the substrate, an oxide film formed in contact with the first capacitor electrode, a second capacitor electrode formed in contact with the oxide film, and an insulating film containing silicon as a main constituting element and formed in contact with the first capacitor electrode and second capacitor electrode, wherein said first capacitor electrode or said second capacitor electrode is formed from a plurality of electrode films, and an electrode film among the plurality of electrode films contacting with the insulating film contains as a main constituting element at least one element selected from the group consisting of rhodium, ruthenium, iridium, osmium, and platinum, and as an adding element at least one element selected from the group consisting of palladium, nickel, cobalt, and titanium.

6. A semiconductor device according to claim 5 wherein the adding element is contained in a concentration of 10 to 25 atom %.

* * * * *